US012730439B2

(12) United States Patent
Yamamoto et al.

(10) Patent No.: US 12,730,439 B2
(45) Date of Patent: Sep. 8, 2026

(54) INFORMATION PROCESSING SYSTEM, ABNORMALITY DETECTION METHOD, AND HEAT TREATMENT APPARATUS

(71) Applicant: Tokyo Electron Limited, Tokyo (JP)

(72) Inventors: Masakazu Yamamoto, Iwate (JP); Tadashi Enomoto, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 507 days.

(21) Appl. No.: 18/229,441

(22) Filed: Aug. 2, 2023

(65) Prior Publication Data

US 2024/0061413 A1 Feb. 22, 2024

(30) Foreign Application Priority Data

Aug. 19, 2022 (JP) ................................ 2022-131129

(51) Int. Cl.
*G05B 23/02* (2006.01)
*G06F 30/20* (2020.01)

(52) U.S. Cl.
CPC ......... *G05B 23/0243* (2013.01); *G06F 30/20* (2020.01)

(58) Field of Classification Search
CPC ............ G05B 23/0243; G05B 23/0232; G05B 19/0426; G06F 30/20; G06F 11/324; G06F 11/3457; H01L 21/67248; H01L 21/67253; H01L 21/67288
See application file for complete search history.

(56) References Cited

FOREIGN PATENT DOCUMENTS

JP 2021-132140 A 9/2021
KR 101598557 B1 * 3/2016 .......... H01L 21/324

OTHER PUBLICATIONS

English machine translation of Ji et al. (KR-101598557-B1) (Year: 2016).*

* cited by examiner

*Primary Examiner* — Geoffrey T Evans
(74) *Attorney, Agent, or Firm* — Venjuris, P.C.

(57) ABSTRACT

An information processing system includes a heat treatment apparatus that performs heat treatment on a processing target substrate by using a heating unit, and an information processing apparatus that controls power supplied to the heating unit. The information processing system further includes a heating control unit that controls the power supplied to the heating unit based on a measured temperature and a set temperature, a virtual power output unit that outputs virtual power supplied to a simulation model of the heat treatment apparatus based on the set temperature and a predicted temperature, a temperature prediction unit that outputs the predicted temperature, based on the virtual power, to the virtual power output unit by using the simulation model, and an abnormality detection unit that detects an abnormality in the heat treatment apparatus based on a difference between the power controlled by the heating control unit and the virtual power.

7 Claims, 6 Drawing Sheets

INFORMATION PROCESSING SYSTEM, ABNORMALITY DETECTION METHOD, AND HEAT TREATMENT APPARATUS

CROSS-REFERENCE TO RELATED APPLICATIONS

The present application is based on and claims priority from Japanese Patent Application No. 2022-131129, filed on Aug. 19, 2022, with the Japan Patent Office, the disclosure of which is incorporated herein in its entirety by reference.

TECHNICAL FIELD

The present disclosure relates to an information processing system, an abnormality detection method, and a heat treatment apparatus.

BACKGROUND

A heat treatment apparatus, for example, supplies a gas into a process tube accommodating wafers therein, and performs predetermined heat treatment on the wafers by heating using a heater. In order to perform uniform heat treatment over the wafers inside the process tube, conventional heat treatment apparatuses have been equipped with temperature sensors at a plurality of predetermined locations inside the process tube and have controlled the heating using the heater based on measured temperatures.

There has been known a technique for visualizing process statuses such as the temperature status of a semiconductor manufacturing apparatus during the execution of a process by the semiconductor manufacturing apparatus (see, e.g., Japanese Patent Laid-Open Publication No. 2021-132140).

SUMMARY

According to an aspect of the present disclosure, an information processing system includes: a heat treatment apparatus that performs heat treatment on a processing target substrate by using a heating unit that heats the processing target substrate inside a processing container while supplying a gas into the processing container, and an information processing apparatus that controls power supplied to the heating unit, the information processing system including: a heating control unit that controls the power supplied to the heating unit based on a measured temperature and a set temperature in the processing container; a virtual power output unit that outputs virtual power supplied to a simulation model of the heat treatment apparatus based on the set temperature in the processing container and a predicted temperature in the processing container; a temperature prediction unit that outputs the predicted temperature in the processing container, based on the virtual power, to the virtual power output unit by utilizing the simulation model of the heat treatment apparatus; and an abnormality detection unit that detects an abnormality in the heat treatment apparatus based on a difference between the power controlled by the heating control unit and the virtual power output by the virtual power output unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for carrying out the present disclosure will be described with reference to the drawings.

Figure 1:
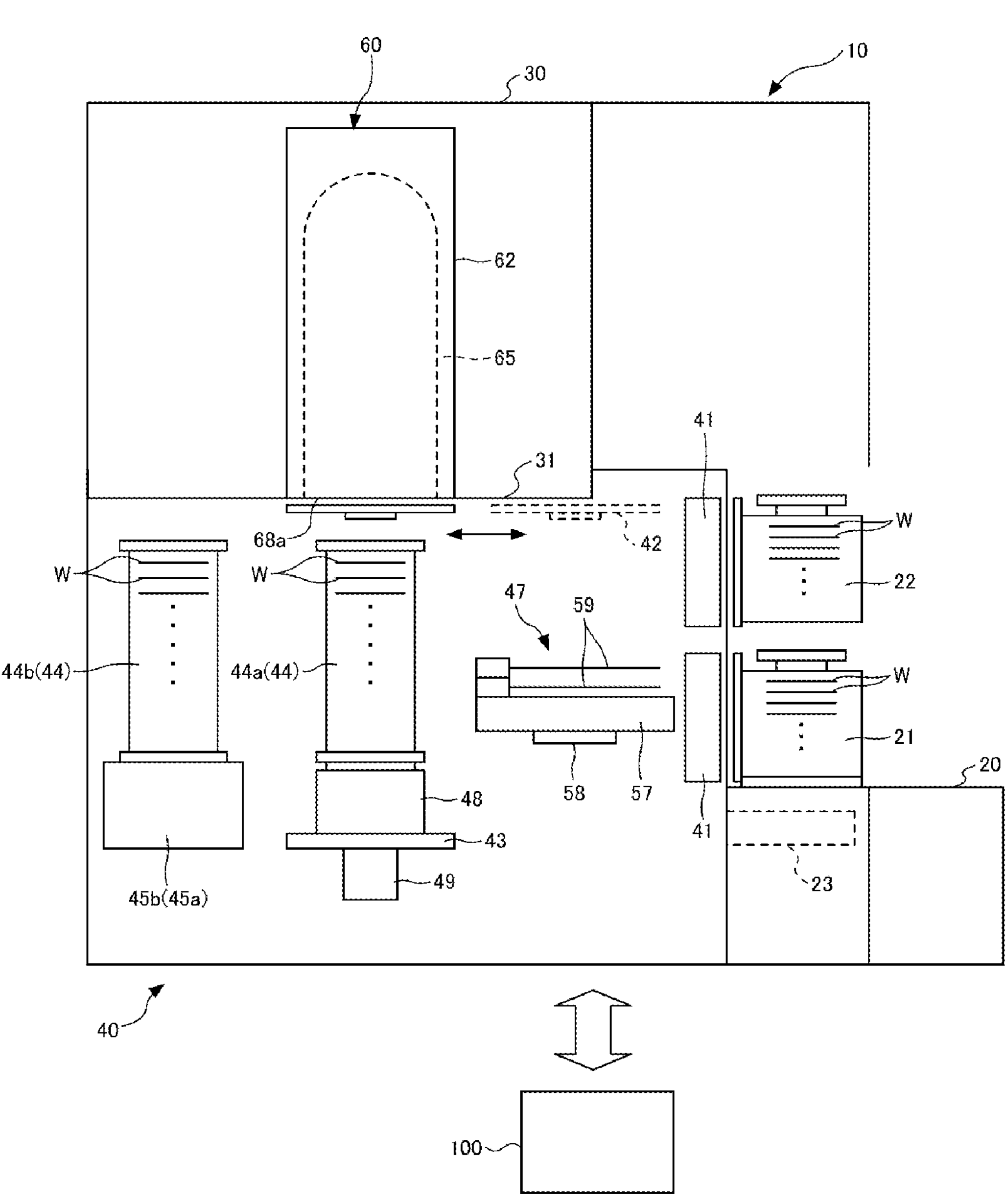
FIG. 1 is a longitudinal cross-sectional view schematically illustrating a heat treatment apparatus according to the present embodiment.

FIG. 1 is a longitudinal cross-sectional view schematically illustrating a heat treatment apparatus according to the present embodiment. The heat treatment apparatus 10 includes a vertical type heat treatment furnace 60, and holds and accommodates wafers W at predetermined intervals in the vertical direction within a boat, thereby performing various heat treatment processes such as oxidation, diffusion, and low-pressure CVD on the wafers W. In the following, descriptions will be made on an example of performing heat treatment on surfaces of the wafers W provided in a processing container 65 by supplying a gas into the processing container 65. The wafer W is an example of a processing target substrate. The processing target substrate is not limited to the circular wafer W.

The heat treatment apparatus 10 of FIG. 1 includes a stage (load port) 20, a housing 30, and a control unit 100. The stage (load port) 20 is provided in a front portion of the housing 30. The housing 30 includes a loading area (working area) 40 and the heat treatment furnace 60.

The loading area 40 is provided at the lower side inside the housing 30. The heat treatment furnace 60 is provided above the loading area 40 inside the housing 30. Further, a base plate 31 is provided between the loading area 40 and the heat treatment furnace 60.

The stage (load port) 20 is configured to load and unload the wafers W into and from the housing 30. Storage containers 21 and 22 are disposed on the stage (load port) 20. Each of the storage containers 21 and 22 is a sealed storage container (hoop) having a detachable lid (not illustrated) on the front side thereof and is capable of accommodating a plurality of (e.g., about 25) wafers W at predetermined intervals.

Further, an alignment device (aligner) 23 may be provided below the stage 20 to align, in one direction, cutouts (e.g., notches) provided on the outer periphery of the wafers W transferred by a transfer mechanism 47.

The loading area (working area) 40 is configured to transfer the wafers W between the storage containers 21 and 22 and a boat 44 to load the boat 44 into the processing container 65 and unload the boat 44 from the processing container 65. In the loading area 40, a door mechanism 41, a shutter mechanism 42, a lid body 43, the boat 44, a base 45*a*, a base 45*b*, a lift mechanism 46 (see FIG. 2), and the transfer mechanism 47 are provided.

The door mechanism 41 is configured to remove the lids of the storage containers 21 and 22 and open the storage containers 21 and 22 to the loading area 40. The shutter mechanism 42 is provided at the upper side of the loading area 40. The shutter mechanism 42 is provided to cover (or close) a furnace opening 68*a* in order to reduce or prevent high-temperature heat inside the furnace from being released from the furnace opening 68*a* to the loading area 40 when the lid body 43 is open.

The lid body 43 includes a thermal insulation cylinder 48 and a rotation mechanism 49. The thermal insulation cylinder 48 is disposed on the lid body 43. The thermal insulation cylinder 48 is used to prevent the boat 44 from being cooled by heat transfer with the lid body 43 side and keep the boat 44 warm. The rotation mechanism 49 is attached to the bottom of the lid body 43. The rotation mechanism 49 is configured to rotate the boat 44. A rotating shaft of the rotation mechanism 49 is provided so as to pass through the lid body 43 airtightly and rotate a rotary table disposed on the lid body 43.

The lift mechanism 46 drives the lid body 43 so as to move up and down when loading and unloading the boat 44 between the loading area 40 and the processing container 65. Then, the lid body 43 is provided so as to come into contact with the furnace opening 68*a* and seal the furnace opening 68*a* when the lid body 43 moved up by the lift mechanism 46 is loaded into the processing container 65.

The boat 44 disposed on the lid body 43 may rotatably hold the wafers W in a horizontal plane inside the processing container 65. The heat treatment apparatus 10 may include a plurality of boats 44. In the loading area 40, boats 44*a* and 44*b* are provided.

In the loading area 40, the base 45*a*, the base 45*b*, and a boat transfer mechanism are provided. The bases 45*a* and 45*b* are stages onto which the boats 44*a* and 44*b* are transferred from the lid body 43, respectively. The boat transfer mechanism is configured to transfer the boat 44*a* or 44*b* from the lid body 43 to the base 45*a* or 45*b*.

The boats 44*a* and 44*b* are made of, for example, quartz, and are configured to mount the wafers W having a large diameter such as a diameter of 300 mm in a horizontal state at predetermined intervals (pitch width) in the vertical direction. The boats 44*a* and 44*b* are provided with a plurality of (e.g., three) pillars between a top plate and a bottom plate. The pillars are provided with hooks for holding the wafers W. Further, the boats 44*a* and 44*b* may be appropriately provided with auxiliary columns together with the pillars.

The transfer mechanism 47 is configured to transfer the wafers W between the storage container 21 or 22 and the boat 44*a* or 44*b*. The transfer mechanism 47 includes a base 57, a lift arm 58, and a plurality of forks (transfer plates) 59. The base 57 is installed to be movable up and down and pivotable. The lift arm 58 is installed to be movable (liftable) in the vertical direction by ball screws, or others. The base 57 is installed to the elevating arm 58 so as to be horizontally pivotable.

Figure 2:
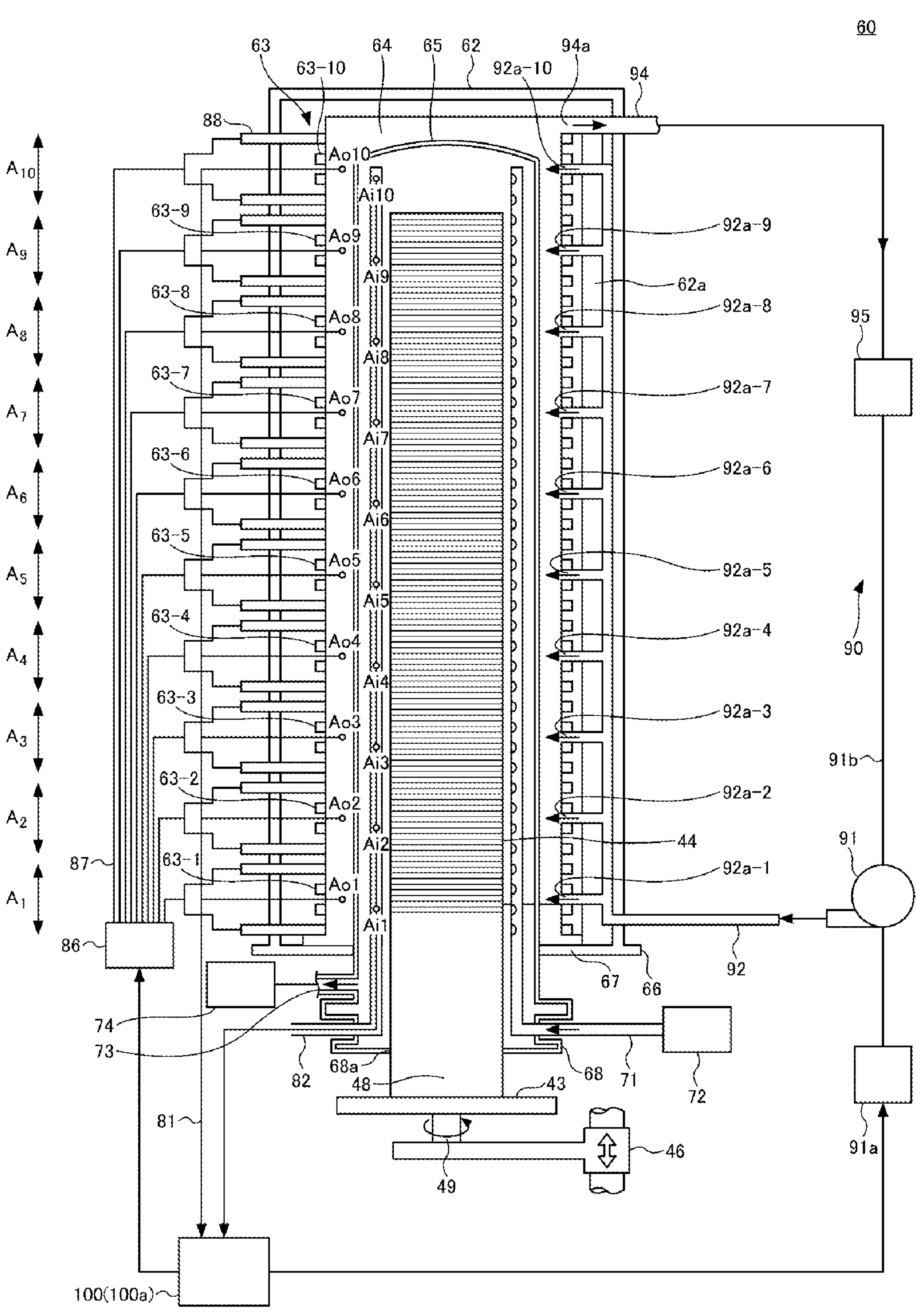
FIG. 2 is a cross-sectional view illustrating a schematic configuration of a heat treatment furnace.

FIG. 2 is a cross-sectional view illustrating a schematic configuration of the heat treatment furnace. The heat treatment furnace 60 in FIG. 2 is an example of a vertical-type furnace for accommodating a plurality of thin disk-shaped wafers W to perform predetermined heat treatment thereon. The heat treatment furnace 60 includes a jacket 62, a heater 63, a space 64, and the processing container 65.

The processing container 65 is configured to accommodate the wafers W held in the boat 44, which are then subjected to heat treatment therein. The processing container 65 is made of, for example, quartz, and has a vertically long shape. The processing container 65 is supported by a base plate 66 via a manifold 68 at the bottom thereof. A gas is supplied from the manifold 68 to the processing container 65 via an injector 71. The injector 71 supplies the gas into the processing container 65 from a blowing portion (hole) thereof. The injector 71 is connected to a gas source 72. Further, the gas supplied to the processing container 65 is discharged through an exhaust port 73 from an exhaust system 74, which is equipped with an evacuation controllable vacuum pump.

The lid body 43 closes the furnace opening 68*a* at the bottom of the manifold 68 when the boat 44 is loaded into the processing container 65. The lid body 43 is installed to be movable up and down by the lift mechanism 46. The thermal insulation cylinder 48 is disposed on the top of the lid body 43. The boat 44 in which a plurality of wafers W are mounted at predetermined intervals in the vertical direction is disposed on the top of the thermal insulation cylinder 48.

The jacket 62 is provided to cover the periphery of the processing container 65 and defines the space 64 around the processing container 65. The jacket 62 has a cylindrical shape similarly to the processing container 65. The jacket 62 is supported by the base plate 66. A heat insulator 62*a* made of, for example, glass wool may be provided inside the jacket 62 and outside the space 64.

The heater 63 is provided to cover the periphery of the processing container 65. For example, the heater 63 is provided inside the jacket 62 and outside the space 64. The heater 63 heats the processing container 65, and also heats the wafers W held in the boat 44, i.e., the wafers W inside the processing container 65. The heater 63 functions as a heating unit that heats the wafers W.

Further, the heater 63 includes, for example, a heating resistor such as a carbon wire. The heater 63 may control the temperature of the gas flowing through the space 64, and may control the heating of the inside of the processing container 65 to a predetermined temperature (e.g., 50° C. to 1,200° C.).

The space 64 and the space inside the processing container 65 are divided into a plurality of unit areas, for example, 10 unit areas $A_1$, $A_2$, $A_3$, $A_4$, $A_5$, $A_6$, $A_7$, $A_8$, $A_9$ and $A_{10}$ in the vertical direction. The heater 63 is divided into heaters 63-1, 63-2, 63-3, 63-4, 63-5, 63-6, 63-7, 63-8, 63-9, and 63-10 so as to correspond to each of the unit areas in the vertical direction, respectively. Each of the heaters 63-1 to 63-10 is configured to be able to independently control heating corresponding to each of the unit areas $A_1$ to $A_{10}$ by the output power (heater power) of a heater output unit 86, which includes, for example, a thyristor. The heaters 63-1 to 63-10 are an example of heating elements.

FIG. 2 illustrates an example in which the space 64 and the space inside the processing container 65 are divided into 10 unit areas in the vertical direction. The number of divided unit areas is not limited to 10, and the space 64 and the space inside the processing container 65 may be divided by any number other than 10. Further, FIG. 2 illustrates uniform division, but the present disclosure is not limited thereto, and the space in the vicinity of the furnace opening 68*a* where a temperature change is large may be divided into fine areas. The heaters 63-1 to 63-10 may be provided at different positions in the vertical direction, respectively, and may not be provided in a one-to-one correspondence with each of the unit areas $A_1$ to $A_{10}$.

In the space 64, heater temperature sensors Ao1 to Ao10 for measuring temperatures corresponding to each of the unit areas $A_1$ to $A_{10}$ are provided as outer T/Cs. Further, in the space inside the processing container 65, processing container internal temperature sensors Ai1 to Ai10 for measuring temperatures corresponding to each of the unit areas $A_1$ to $A_{10}$ are provided as inner T/Cs. The heater temperature sensors Ao1 to Ao10 and the processing container internal temperature sensors Ai1 to Ai10 measure the temperatures in order to measure the temperature distribution in the vertical direction. The temperatures measured by the processing container internal temperature sensors Ai1 to Ai10 are an example of measured temperatures inside the processing container 65.

Measurement signals from the heater temperature sensors Ao1 to Ao10 are input to the control unit 100 via lines 81, respectively. Measurement signals from the processing container internal temperature sensors Ai1 to Ai10 are input to the control unit 100 via lines 82, respectively. The control unit 100 to which the measurement signals are input controls heater power supplied from the heater output unit 86 to the heaters 63-1 to 63-10 based on a set temperature to be described later. The heater output unit 86 supplies the heater power to each of the heaters 63-1 to 63-10 via heater output lines 87 and heater terminals 88 under the control of the control unit 100.

Further, the heat treatment furnace 60 may include a cooling mechanism 90 for cooling the processing container 65. The cooling mechanism 90 includes, for example, a blower 91, a blowing pipe 92, and an exhaust pipe 94.

The blower 91 cools the processing container 65, for example, by blowing a cooling gas containing air into the space 64 where the heater 63 is provided. The blowing pipe 92 sends the cooling gas from the blower 91 to the heater 63. The blowing pipe 92 is connected to each of ejection holes 92*a*-1 to 92*a*-10, and supplies the cooling gas to the space 64.

The exhaust pipe 94 is configured to discharge the air inside the space 64. The space 64 is provided with an exhaust port 94*a* for discharging the cooling gas from the space 64. The exhaust pipe 94 has one end connected to the exhaust port 94*a*.

Further, as illustrated in FIG. 2, the heat treatment furnace 60 may be provided with a heat exchanger 95 in the middle of the exhaust pipe 94, and the other end of the exhaust pipe 94 may be connected to the suction side of the blower 91. Then, the cooling gas discharged through the exhaust pipe 94 may be heat-exchanged with the heat exchanger 95 without being discharged to a factory exhaust system, and then, may be returned to the blower 91 for recirculation. Further, in that case, it may be circulated through an air filter (not illustrated). Alternatively, the cooling gas discharged from the space 64 may be discharged from the exhaust pipe 94 to the factory exhaust system by way of the heat exchanger 95.

The blower 91 may be configured to control the air volume of the blower 91 by controlling the power supplied from a power supply 91*a* including an inverter, for example, in response to an output signal from the control unit 100.

The control unit 100 is implemented by, for example, a computer 500 to be described later. The control unit 100 reads a program recorded in a storage device and sends a control signal to each part constituting the heat treatment apparatus 10 according to the program to perform heat treatment. For example, the control unit 100 adjusts the temperature inside the processing container 65 by controlling the heater power supplied to the heater 63 based on the temperature measured by the processing container internal temperature sensor $A_1$ and a set temperature to be described later.

In the heat treatment apparatus 10 illustrated in FIGS. 1 and 2, when the injector 71 fails, the amount of gas supplied to the unit areas $A_1$ to $A_{10}$ inside the processing container 65 changes from the status thereof before the failure of the injector 71. Examples of the failure of the injector 71 include breakage and disconnection. Examples of the breakage of the injector 71 include not only damage to a certain injector portion such as a base portion due to impact, but also fragmentation of a blowing portion due to etching.

For example, when the base portion of the injector 71 is broken, the amount of gas supplied to an upper region inside the processing container 65 will decrease and the amount of gas supplied to a lower region inside the processing container 65 will increase. When the temperature of gas supplied from the injector 71 is lower than the temperature of the processing container 65, the heater power required for heating the upper region of the processing container 65 will decrease. Further, when the temperature of gas supplied from the injector 71 is lower than the temperature of the processing container 65, the heater power required for heating the lower region of the processing container 65 will increase.

As such, in the heat treatment apparatus 10, the failure of the injector 71 causes a change in the heater power supplied to the heater 63 from the pre-failure status. Therefore, the heat treatment apparatus 10 according to the present embodiment predicts the heater power (virtual power) supplied to the heater 63 in the non-faulty status as described later, and compares it with the heater power actually supplied to the heater 63 in the heat treatment apparatus 10. Then, when there is a difference between the predicted virtual power and the heater power actually supplied to the heater 63 in the heat treatment apparatus 10, the heat treatment apparatus may detect the occurrence of abnormalities in the heat treatment apparatus 10 such as the failure of the injector 71.

For example, under the following assumptions, the heater power actually supplied to the heater 63 in the heat treatment apparatus 10 changes as follows due to the breakage of the injector 71.

(Assumptions)

Gas flow rate by mass flow controller (MFC): 500 sccm

Gas temperature: 150° C.

Temperature of processing container 65: 500° C.

(Calculations)

Mass flow rate of $SiH_4$: 0.000011943 kg/s

Specific heat of $SiH_4$: 1213.12

Difference between gas temperature and temperature of processing container 65: 500° C.-150° C.=350° C.

The specific heat of $SiH_4$ is calculated simply as 1093×1.11=1213.23 by using the factors that $SiH_4$ has a specific gravity 1.11 times higher than that of air and that the specific heat of air at around 500° C. is 1093.

The change in the heater power supplied to the heater 63 of the heat treatment apparatus 10 may be calculated as 0.000011943×1213.23×350=5.071 W. For example, the following table shows the heater power supplied to the heater 63 for each unit area. The unit area may also be referred to as zone. In the case of the following table, the heater power for all unit areas except the unit area Z01 is around 200 W.

TABLE 1

| Unit Area | Z01 | Z02 | Z03 | Z04 | Z05 | Z06 | Z07 | Z08 |
|---|---|---|---|---|---|---|---|---|
| Heater Power | 2047.64 | 336.4 | 235.48 | 211.42 | 168.2 | 168.2 | 117.12 | 258.4 |

Accordingly, since the heater 63 in all unit areas except the unit area Z01 undergoes a change of approximately 2.5% (5.071 W÷200 W) in the heater power due to the breakage of the injector 71, it is possible to detect the breakage of the injector 71 by comparing the predicted virtual power with the real-time power.

Figure 3:
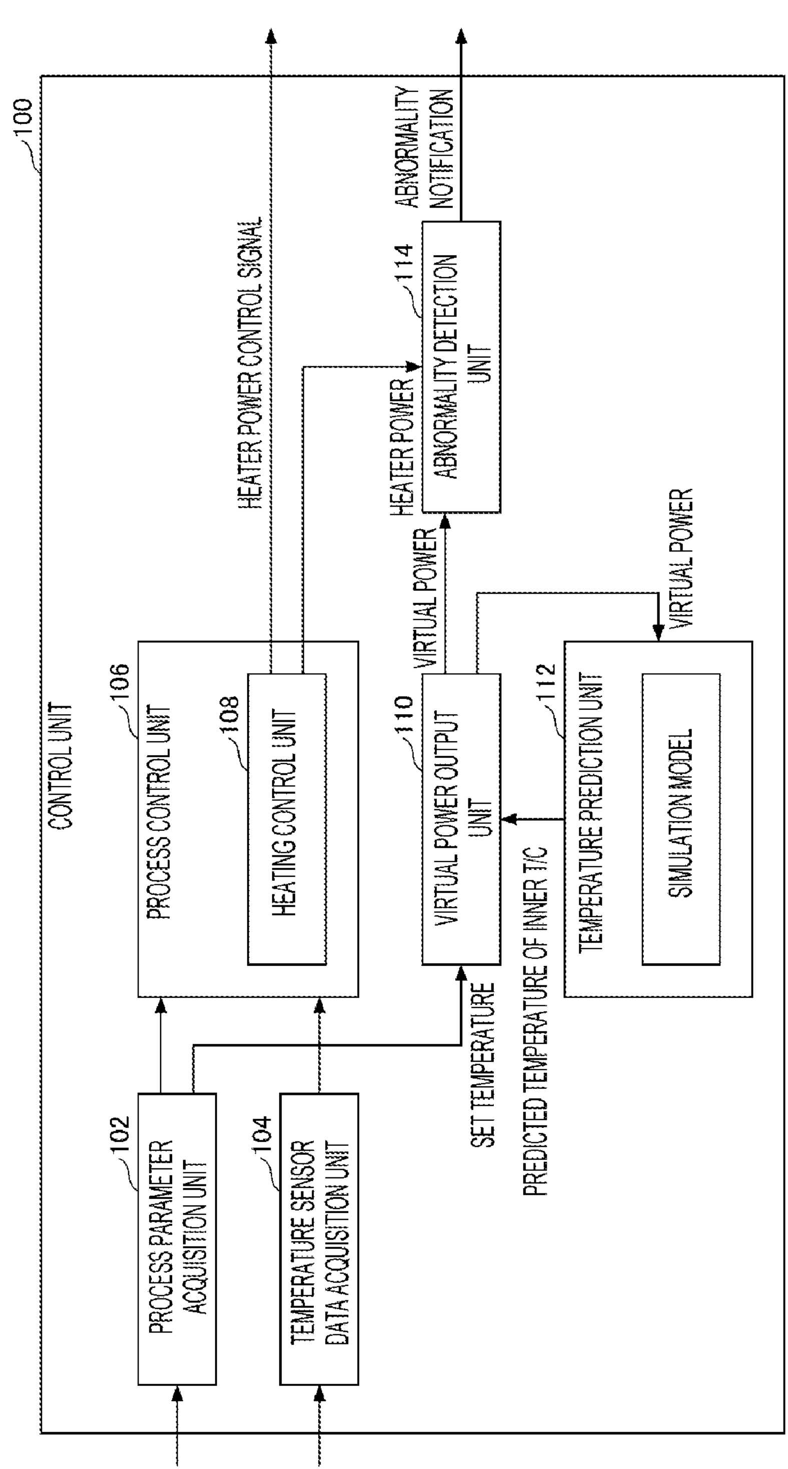
FIG. 3 is a diagram illustrating an exemplary functional configuration of a control unit of the heat treatment apparatus according to the present embodiment.

The control unit 100 of the heat treatment apparatus 10 is implemented by a functional configuration illustrated in, for example, FIG. 3. FIG. 3 is a diagram illustrating an exemplary functional configuration of the control unit of the heat treatment apparatus according to the present embodiment.

The control unit 100 of the heat treatment apparatus 10 according to the present embodiment is implemented by functional blocks illustrated in, for example, FIG. 3. FIG. 3 is an exemplary functional block diagram of the control unit according to the present embodiment. In the functional block diagram of FIG. 3, illustration of components unnecessary for the description of the present embodiment is omitted.

The control unit 100 implements a process parameter acquisition unit 102, a temperature sensor data acquisition unit 104, a process control unit 106, a heating control unit 108, a virtual power output unit 110, a temperature prediction unit 112, and an abnormality detection unit 114 by executing a program.

The process parameter acquisition unit 102 acquires process parameters of a process executed by the heat treatment apparatus 10. The process parameter acquisition unit 102 provides the acquired process parameters to the process control unit 106. The process parameters include a set temperature inside the processing container 65. Further, the process parameter acquisition unit 102 provides the set temperature inside the processing container 65 to the virtual power output unit 110.

The temperature sensor data acquisition unit 104 acquires the measured temperatures from the heater temperature sensor Ao (hereinafter referred to as outer T/C) and the processing container internal temperature sensor Ai (hereinafter referred to as inner T/C). Further, the temperature sensor data acquisition unit 104 provides the acquired measured temperatures to the process control unit 106.

The process control unit 106 executes a process by the heat treatment apparatus 10 based on the process parameters provided from the process parameter acquisition unit 102. The process control unit 106 has a temperature control unit. The temperature control unit determines the heater power supplied from the heater output unit 86 to the heater 63 based on the provided measured temperature and set temperature inside the processing container 65. The heating control unit 108 supplies a heater power control signal to the heater output unit 86, thereby controlling the supply of the heater power determined by the temperature control unit from the heater output unit 86 to the heater 63.

The virtual power output unit 110 has the same temperature control unit (hereinafter referred to as a virtual temperature control unit) as in the process control unit 106. The virtual temperature control unit of the virtual power output unit 110 determines the heater power supplied to the heater 63 (hereinafter referred to as virtual power) based on the set temperature inside the processing container 65, provided from the process parameter acquisition unit 102, and a predicted temperature of the inner T/C, which will be described later, provided from the temperature prediction unit 112. The virtual power output unit 110 provides the determined virtual power to the temperature prediction unit 112.

The temperature prediction unit 112 has a simulation model of the heat treatment apparatus 10. The simulation model of the heat treatment apparatus 10 is a physical model, and is a thermal model that outputs the predicted temperature of the inner T/C inside the processing container 65 based on the virtual power. The simulation model may use, for example, a 1DCAE simulation model. In the simulation model, a heat exchange relationship, specific heat, and others are modeled.

For example, by creating a 1DCAE physical model that incorporates a configuration of the heater 63, a reactor configuration, and a configuration of the surroundings of the heater 63, the simulation model may predict and output the temperature of the inner T/C inside the processing container 65, which is example of output data, based on the heater power provided to the heater 63, which is example of input data.

As such, the simulation model of the present embodiment may predict the temperature of the inner T/C inside the processing container 65 and output it as the predicted temperature based on the input of required information such as the virtual power.

The temperature prediction unit 112 uses the simulation model of the heat treatment apparatus 10 to predict the temperature of the inner T/C inside the processing container 65 based on the virtual power, and outputs (feed backs) the predicted temperature of the inner T/C to the virtual power output unit 110.

As such, the virtual power output unit 110 and the temperature prediction unit 112 may determine the virtual power based on the set temperature inside the processing container 65, provided from the process parameter acquisition unit 102, by using the same virtual temperature control unit as in the process control unit 106. The virtual power determined by the virtual power output unit 110 is prediction of the heater power supplied to the heater 63 in the non-faulty status of the injector 71.

The abnormality detection unit 114 continuously compares the heater power controlled by the heating control unit 108 with the virtual power provided from the virtual power output unit 110. The abnormality detection unit 114 detects abnormalities in the heat treatment apparatus 10, such as the failure of the injector 71, based on a difference between the heater power controlled by the heating control unit 108 and the virtual power provided from the virtual power output unit 110.

For example, when the injector 71 of the heat treatment apparatus 10 fails, the amount of gas supplied into the process container 65 will change from the previous non-faulty status as described above. Accordingly, the heater power controlled by the heating control unit 108 will increase or decrease according to a change in the measured temperature due to an increase or decrease in the amount of gas supplied into the processing container 65. Meanwhile, since the virtual power provided from the virtual power output unit 110 is predicted based on the temperature predicted by the temperature prediction unit 112, rather than the measured temperature, it is not affected by the failure of the injector 71 of the heat treatment apparatus 10.

Therefore, the abnormality detection unit 114 may detect the occurrence of abnormalities when the difference between the heater power controlled by the heating control unit 108 and the virtual power provided from the virtual power output unit 110 is a threshold value or more. When the abnormality detection unit 114 detects the occurrence of abnormalities, it notifies the occurrence of abnormalities through monitor display, lighting of an indicator light, sound emission, or other notifications.

Figure 4:
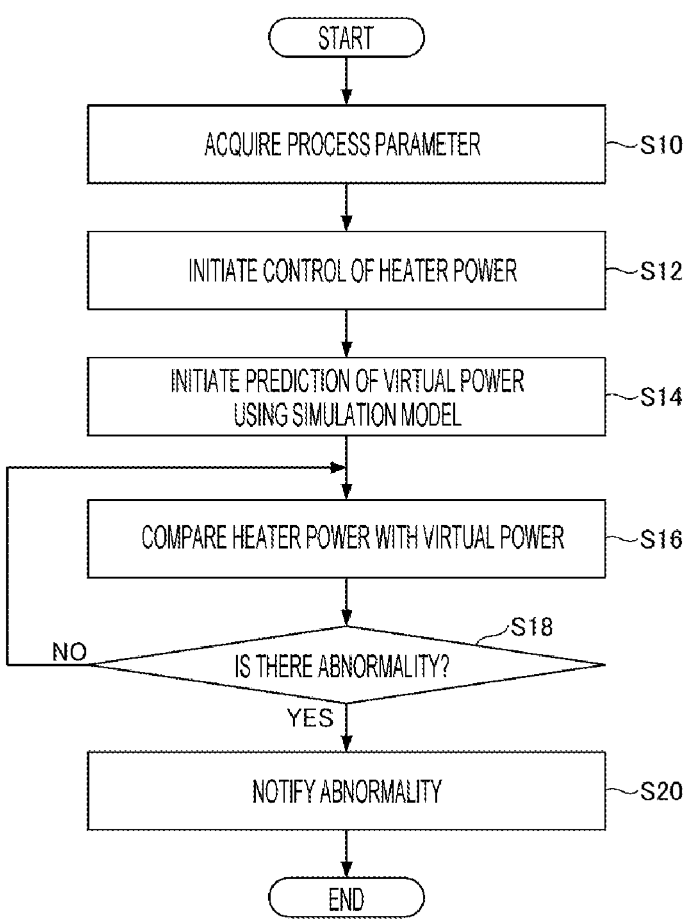
FIG. 4 is a flowchart of an exemplary processing procedure of the control unit according to the present embodiment.

FIG. 4 is a flowchart of an exemplary processing procedure of the control unit according to the present embodiment. In step S10, the control unit 100 of the heat treatment apparatus 10 acquires process parameters of a process executed by the heat treatment apparatus 10.

In step S12, the process control unit 106 of the control unit 100 executes the process with the heat treatment apparatus 10 based on the acquired process parameters, and initiates the control of heater power supplied to the heater 63. This leads to the adjustment of the temperature inside the processing container 65 based on a set temperature.

In step S14, the control unit 100 initiates the prediction of virtual power by utilizing the virtual temperature control unit and the simulation model. For example, the virtual temperature control unit of the virtual power output unit 110 determines the virtual power based on the set temperature inside the processing container 65 and the predicted temperature of the inner T/C provided from the temperature prediction unit 112. Further, the temperature prediction unit 112 predicts the temperature of the inner T/C inside the processing container 65, based on the virtual power, by utilizing the simulation model of the heat treatment apparatus 10, and feeds back the predicted temperature to the virtual power output unit 110.

In step S16, the abnormality detection unit 114 of the control unit 100 compares the heater power controlled by the heating control unit 108 with the virtual power provided from the virtual power output unit 110 either continuously or at predetermined intervals.

The abnormality detection unit 114 determines whether or not there are abnormalities in the heat treatment apparatus 10 based on the difference between the heater power controlled by the heating control unit 108 and the virtual power provided from the virtual power output unit 110. For example, the abnormality detection unit 114 determines that there are abnormalities in the heat treatment apparatus 10 when the difference between the heater power controlled by the heating control unit 108 and the virtual power provided from the virtual power output unit 110 is a threshold value or more.

The abnormality detection unit 114 repeats the processings of steps S16 and S18 until it is determined in step S18 that there are abnormalities in the heat treatment apparatus 10 or until the process is terminated. When it is determined that there are abnormalities in the heat treatment apparatus 10, the abnormality detection unit 114 proceeds to step S20 and notifies the occurrence of abnormalities through monitor display, lighting of an indicator light, sound emission, or other notifications.

As such, in the present embodiment, it is possible to detect abnormalities in the heat treatment apparatus 10 such as the failure of the injector 71 by comparing the heater power controlled by the heating control unit 108 with the virtual power provided from the virtual power output unit 110. Abnormalities that are detectable based on gas flow rate according to the present embodiment include, for example, the failure of a mass flow controller and improper calibration such as zero point offset of the mass flow controller, in addition to the failure of the injector 71.

Further, when an injector nozzle hole, which is a blowing portion of the injector 71 formed by etching, gradually enlarges due to excessive etching, the amount of gas supplied from a lower portion of the injector 71 increases while the amount of gas supplied from an upper portion of the injector 71 decreases. Therefore, the heater power supplied to the heater 63 gradually shifts such that the heater power allocated to the lower unit area increases and the heater power allocated to the upper unit area decreases, in response to a change in the amount of gas supplied to the processing container 65. Accordingly, the control unit 100 may also perform early detection of issues such as the breakage of the injector 71 due to etching by monitoring this shift in heater power.

The present embodiment has described an example of detecting abnormalities in the heat treatment apparatus 10 during the process, but abnormalities in the heat treatment apparatus 10 may also be detected when the processing container 65 is empty such as when the boat 44 is unloaded. For example, when the processing container 65 is empty such as when the boat 44 is unloaded, the heat treatment apparatus 10 may create a gas check routine of releasing a gas such as $N_2$ gas from the injector 71 as a purge/check processing and detecting the failure of the injector 71 from the difference between the heater power and the virtual power. By implementing the gas check routine, the heat treatment apparatus 10 may prevent in advance the initiation of a process in the faulty status of the injector 71.

The control unit 100 of the heat treatment apparatus 10 may use digital twin technology to detect abnormalities in the heat treatment apparatus 10 during the heat treatment.

In the above-described embodiment, the control unit 100 of the heat treatment apparatus 10 was responsible for detecting abnormalities in the heat treatment apparatus 10. The processing of detecting abnormalities in the heat treatment apparatus 10 may also be executed by other information processing apparatuses that are connected to the control unit 100 to enable data communication therebetween.

Figure 5:
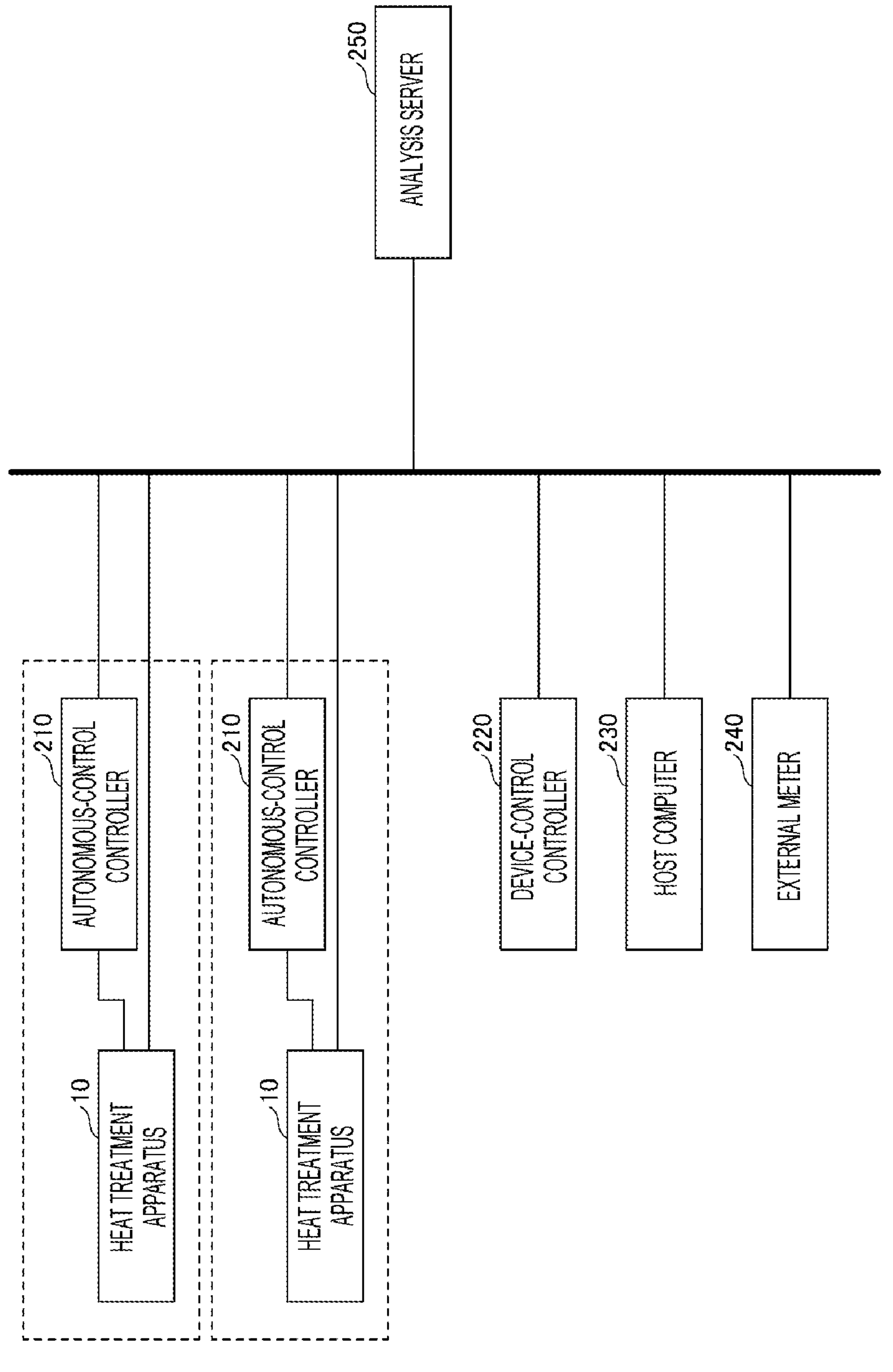
FIG. 5 is a diagram illustrating an exemplary configuration of an information processing system according to the present embodiment.

FIG. 5 is a diagram illustrating an exemplary configuration of an information processing system according to the present embodiment. The information processing system of FIG. 5 includes the heat treatment apparatus 10, an autonomous-control controller 210, a device-control controller 220, a host computer 230, an external meter 240, and an analysis server 250.

The heat treatment apparatus 10, the autonomous-control controller 210, the device-control controller 220, the host computer 230, the external meter 240, and the analysis server 250 are connected to enable communication therebetween via a network such as a local area network (LAN).

The heat treatment apparatus 10 executes a process in response to a control command (process parameters) output from the device-control controller 220. The autonomous-control controller 210 is configured to autonomously control the heat treatment apparatus 10 and performs tasks such as the simulation of process statuses during the execution of a process by the heat treatment apparatus 10, by utilizing a simulation model. The autonomous-control controller 210 is provided for each heat treatment apparatus 10. The autonomous-control controller 210 executes a processing of detecting abnormalities in the heat treatment apparatus 10, which is performed by the control unit 100 in the above-described embodiment.

Further, the device-control controller 220 is a controller having a computer configuration for controlling the heat treatment apparatus 10. The device-control controller 220 outputs process parameters, used for the control of control components of the heat treatment apparatus 10, to the heat treatment apparatus 10. The host computer 230 is an example man machine interface (MMI) that receives instructions regarding the heat treatment apparatus 10 from an operator and provides information regarding the heat treatment apparatus 10 to the operator.

The external meter 240 is a meter that measures the results after the execution of the process based on the process parameters, such as a film thickness meter, a sheet resistance meter, and a particle meter. For example, the external meter 240 measures the adhesion state of a film on a wafer such as a monitor wafer.

The analysis server 250 performs, for example, data analysis necessary for the processing executed by the autonomous-control controller 210. The analysis server 250 may be adapted to edit the simulation model of the heat treatment apparatus 10 with machine learning or other techniques based on data collected from a plurality of heat treatment apparatuses 10.

The information processing system of FIG. 5 is merely one example, and it goes without saying that there are various system configuration examples depending on the application and purpose. The categorization of devices such as the heat treatment apparatus 10, the autonomous-control controller 210, the device-control controller 220, the host computer 230, the external meter 240, and the analysis server 250 illustrated in FIG. 5 is provided as an example.

For example, the information processing system may have various configurations, such as the integrated configuration of at least two devices among the heat treatment apparatus 10, the autonomous-control controller 210, the device-control controller 220, the host computer 230, the external meter 240, and the analysis server 250, or further division into separate configurations.

Figure 6:
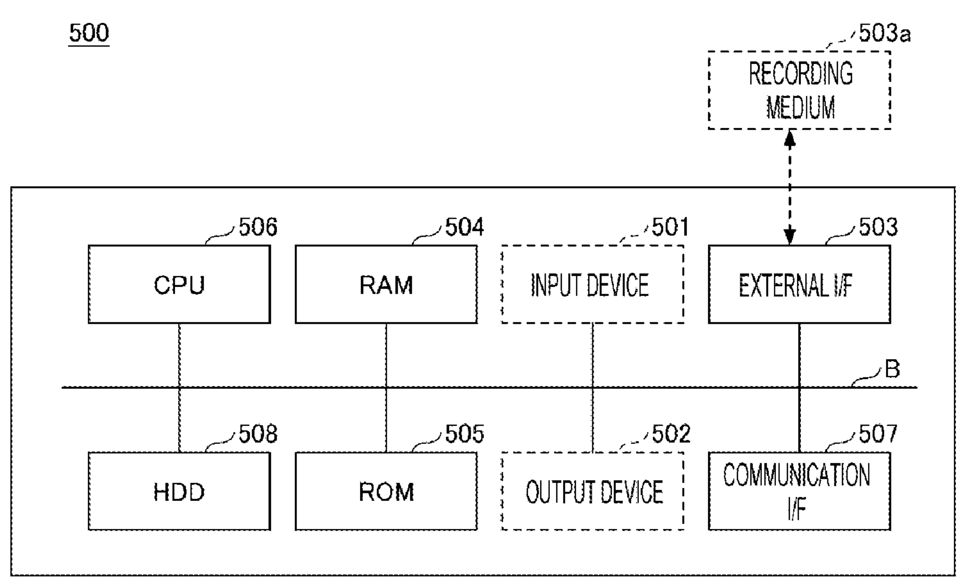
FIG. 6 is a diagram illustrating an exemplary hardware configuration of a computer.

The autonomous-control controller 210, the device-control controller 220, the host computer 230, and the analysis server 250 of the information processing system illustrated in FIG. 5 are implemented by, for example, a computer having a hardware configuration as illustrated in FIG. 6. Further, the control unit 100 of the heat treatment apparatus 10 described above is also implemented by a computer having a hardware configuration as illustrated in FIG. 6. FIG. 6 is a diagram illustrating an exemplary hardware configuration of a computer.

A computer 500 of FIG. 6 includes an input device 501, an output device 502, an external interface (UF) 503, a random access memory (RAM) 504, a read only memory (ROM) 505, a central processing unit (CPU) 506, a communication OF 507, and a hard disk drive (HDD) 508, among others, and the respective components are connected to each other via a bus B. The input device 501 and the output device 502 may be connected and used as needed.

The input device 501 includes devices such as a keyboard, a mouse, and a touch panel, which are used by an operator or user to input each operation signal. The output device 502 is a display or similar device, which is used to display the processing results generated by the computer 500. The communication I/F 507 is an interface that connects the computer 500 to a network. The HDD 508 is an example of a non-volatile storage device used to store programs and data.

The external I/F 503 is an interface to an external device. The computer 500 may perform reading from and/or writing to a recording medium 503*a*, such as a secure digital (SD) memory card, via the external I/F 503. The ROM 505 is an example of a non-volatile semiconductor memory (storage device) in which programs and data are stored. The RAM 504 is an example of a volatile semiconductor memory (storage device) used to temporarily hold programs and data.

The CPU 506 is an arithmetic unit that reads out programs and data from storage devices such as the ROM 505 and the HDD 508 onto the RAM 504 and executes a processing to implement the overall control and functions of the computer 500.

The autonomous-control controller 210, the device-control controller 220, the host computer 230, and the analysis server 250 of the information processing system illustrated in FIG. 5 may implement various functions by the hardware configuration of the computer 500 in FIG. 6. Further, the control unit 100 of the heat treatment apparatus 10 described above may also implement various functions by the hardware configuration of the computer 500 illustrated in FIG. 6.

In the present embodiment, digital twin of the actual heat treatment apparatus 10 and the simulated heat treatment apparatus 10 is implemented by causing the autonomous-control controller 210 to execute the simulation of a physical model based on real-time process parameters of the heat treatment apparatus 10. By comparing the heater power of the actual heat treatment apparatus 10 and the heater power of the simulated heat treatment apparatus 10 in real time, it is possible to detect abnormalities in the heat treatment apparatus 10 during the heat treatment.

According to the present disclosure, it is possible to detect abnormalities in a heat treatment apparatus during the execution of a heat treatment by utilizing a simulation model.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An information processing system comprising:

a heat treatment apparatus configured to perform heat treatment on a processing target substrate by using a heater that heats the processing target substrate inside a processing container while supplying a gas into the processing container; and an information processing apparatus configured to control power supplied to the heater, wherein the heat treatment apparatus includes:

a heating control circuitry configured to control the power supplied to the heater based on a measured temperature and a set temperature in the processing container;

a virtual power output circuitry configured to output virtual power supplied to a simulation model of the heat treatment apparatus based on the set temperature in the processing container and a predicted temperature in the processing container;

a temperature prediction circuitry configured to output the predicted temperature in the processing container, based on the virtual power, to the virtual power output circuitry by using the simulation model of the heat treatment apparatus; and an abnormality detection circuitry configured to detect an abnormality in a function of supplying the gas into the processing container based on a difference between the power controlled by the heating control circuitry and the virtual power output by the virtual power output circuitry.

2. The information processing system according to claim 1, wherein the abnormality detection circuitry is configured to detect an abnormality in an injection that supplies the gas into the processing container based on the difference between the power controlled by the heating control circuitry and the virtual power output by the virtual power output circuitry.

3. The information processing system according to claim 1, wherein the virtual power output circuitry is configured to output the virtual power, based on the set temperature in the processing container and the predicted temperature in the processing container.

4. The information processing system according to claim 1, wherein the heater corresponds to one of a plurality of unit areas obtained by dividing an area inside the processing container, and the abnormality detection circuitry is configured to calculate the difference between the power controlled by the heating control circuitry and the virtual power output by the virtual power output circuitry for each unit area, and to detect the abnormality in the heat treatment apparatus based on the difference.

5. The information processing system according to claim 1, wherein the simulation model of the heat treatment apparatus is a thermal model that outputs the predicted temperature in the processing container based on the virtual power.

6. An abnormality detection method comprising:

providing an information processing system including:

a heat treatment apparatus configured to perform heat treatment on a processing target substrate by using a heater that heats the processing target substrate inside a processing container while supplying a gas into the processing container; and an information processing apparatus configured to control power supplied to the heater;

controlling the power supplied to the heater based on a measured temperature and a set temperature in the processing container;

outputting virtual power supplied to a simulation model of the heat treatment apparatus based on the set temperature in the processing container and a predicted temperature in the processing container;

outputting the predicted temperature in the processing container based on the virtual power by using the simulation model of the heat treatment apparatus; and detecting an abnormality in a function of supplying the gas into the processing container based on a difference between the power supplied to the heater and the virtual power.

7. A heat treatment apparatus comprising:

a processing container configured to accommodate a processing target substrate;

a heater configured to heat the processing target substrate inside the processing container while supplying a gas into the processing container;

a heating control circuitry configured to control the power supplied to the heater based on a measured temperature and a set temperature in the processing container;

a virtual power output circuitry configured to output virtual power supplied to a simulation model of the heat treatment apparatus based on the set temperature in the processing container and a predicted temperature in the processing container;

a temperature prediction circuitry configured to output the predicted temperature in the processing container, based on the virtual power, to the virtual power output circuitry by using the simulation model of the heat treatment apparatus; and an abnormality detection circuitry configured to detect an abnormality in a function of supplying the gas into the processing container based on a difference between the power controlled by the heating control circuitry and the virtual power output by the virtual power output circuitry.

* * * * *